United States Patent
Lee (10) Patent No.: US 7,487,414 B2
(45) Date of Patent: Feb. 3, 2009

(54) PARALLEL BIT TEST CIRCUITS FOR TESTING SEMICONDUCTOR MEMORY DEVICES AND RELATED METHODS

(75) Inventor: Hi-Choon Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 359 days.

(21) Appl. No.: 11/500,126

(22) Filed: Aug. 7, 2006

(65) Prior Publication Data

US 2007/0283198 A1  Dec. 6, 2007

(30) Foreign Application Priority Data

May 8, 2006   (KR) ...................... 10-2006-0040884

(51) Int. Cl.
   *G11C 29/00*   (2006.01)
(52) U.S. Cl. ............................ 714/718; 714/30; 714/48
(58) Field of Classification Search ................. 365/201; 702/117; 435/6; 714/733, 723, 718, 30, 714/48
   See application file for complete search history.

(56) References Cited

U.S. PATENT DOCUMENTS 5,991,903 A    11/1999  Shin et al.
6,853,597 B2 *  2/2005  Jain ........................... 365/201
6,865,694 B2 *  3/2005  Schutt et al. ................... 714/30
2005/0102595 A1 * 5/2005  Seo ............................. 714/736
2005/0114064 A1 * 5/2005  Shin et al. ................... 702/117
2005/0257107 A1 * 11/2005 Kim ............................ 714/718
2007/0196839 A1 * 8/2007  Pinchin et al. ................. 435/6

\* cited by examiner

*Primary Examiner*—David Ton
(74) *Attorney, Agent, or Firm*—Myers Bigel Sibley & Sajovec, PA (57) ABSTRACT

An integrated circuit device includes a test circuit and at least one flag generator circuit. The test circuit is configured to generate first and second sets of test results in parallel in response to a memory test operation. The first and second sets of test results respectively correspond to first and second memory banks. The test circuit is further configured to merge respective ones of the first set of test results with respective ones of the second set of test results to provide a set of merged test results to respective ones of a set of output terminals of the integrated circuit device. The at least one flag generator circuit is configured to generate a first flag signal that indicates a presence of at least one memory test error in the first set of test results, and a second flag signal that indicates a presence of at least one memory test error in the second set of test results. Based on the set of merged test results and the first and second flag signals, the test circuit may determine which of the memory blocks of the first and second memory banks includes a defective memory cell therein. Related methods are also discussed.

23 Claims, 8 Drawing Sheets

PARALLEL BIT TEST CIRCUITS FOR TESTING SEMICONDUCTOR MEMORY DEVICES AND RELATED METHODS

CROSS REFERENCE TO RELATED APPLICATIONS

This application claims priority under 35 U.S.C. §119 from Korean Patent Application 10-2006-0040884, filed on May 8, 2006, the disclosure of which is hereby incorporated by reference herein in its entirety.

1. Field of the Invention

The present invention relates to semiconductor memory devices, and more particularly, to circuits for testing semiconductor memory devices and methods of operating the same.

2. Background of the Invention

In semiconductor memory devices such as Dynamic Random Access Memory Devices (DRAMs), accurately reading and/or writing data to memory cells may require a relatively high degree of precision. As such, it may be advantageous to discover defective memory cells (i.e., memory cells that may not be accurately read and/or written) during device testing. However, trends toward increasingly high density devices may result in relatively high occurrence of such "failed" cells, despite developments in manufacturing processes that may increase the number of memory cells integrated in one chip. Accordingly, unless a relatively precise test for failed cells is performed, the reliability of semiconductor memory devices may be difficult to guarantee.

In testing memory cells one cell at a time, the total test time for a highly-integrated semiconductor memory device may be extended, which may increase cost. Thus, reducing test time may be important for highly-integrated semiconductor memory devices. Accordingly, it is known to use a parallel bit test method to shorten test time of semiconductor memory devices.

A conventional parallel bit test method may employ an XOR(eXclusive OR) and/or XNOR(eXclusive NOR) logic circuit. More specifically, after writing the same data to a plurality of memory cells, a logic operation may be performed through an XOR and/or XNOR logic circuit in a read operation. When the same data is read from each of the plurality of memory cells, a "pass" decision may be provided, and when the data read from even one memory cell is different, a "fail" decision may be provided, which may shorten test time.

In a conventional parallel bit test method, a test may be performed one memory bank at a time. For example, one memory bank may be divided into 16 blocks and/or units of repair, and the test may be performed through 16 input/output pads.

Figure 1:
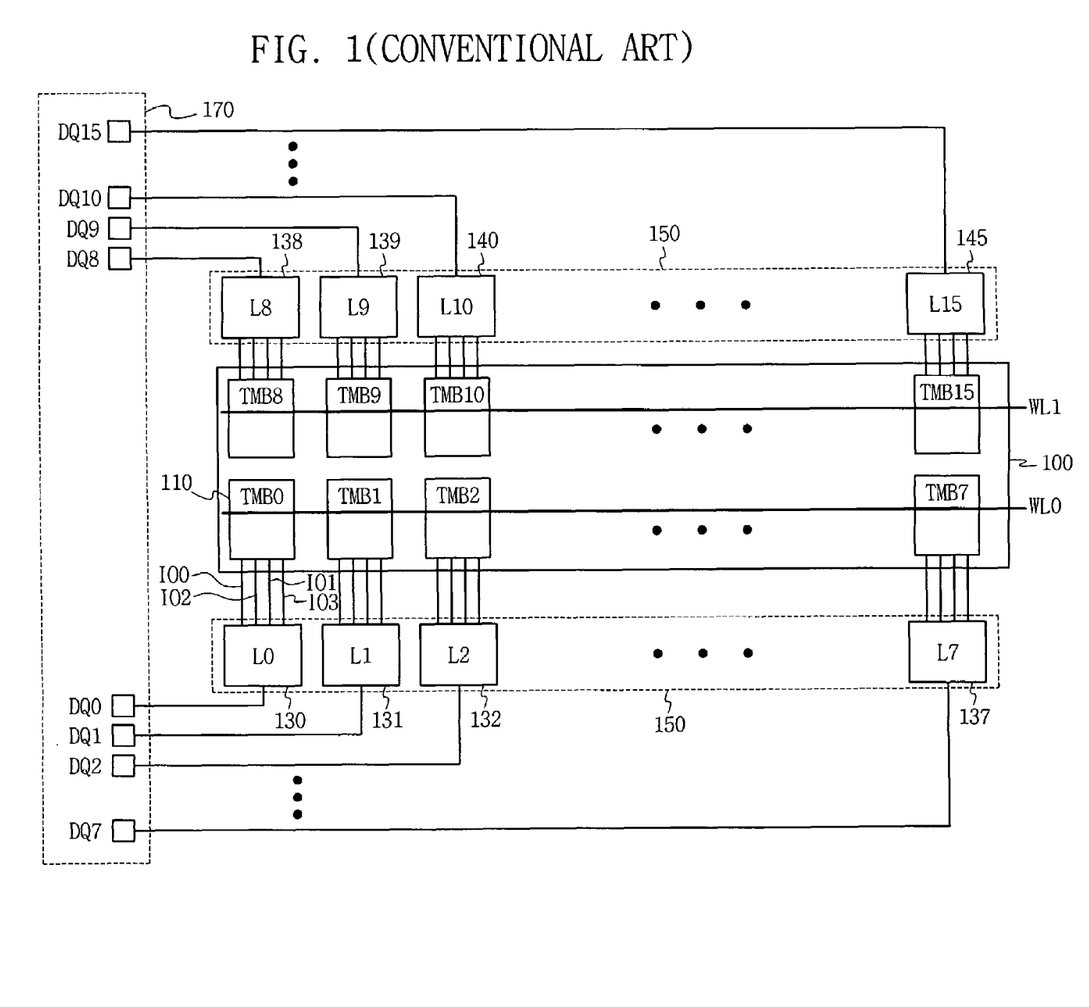
FIG. 1 is a schematic diagram illustrating a conventional semiconductor memory device configured to perform a parallel bit test.

FIG. 1 illustrates a structure of a conventional device configured to perform a parallel bit test. Referring to FIG. 1, a conventional parallel bit testing device may include a memory bank 100, a parallel bit test logic block 150 and input/output pads 170. The memory bank 100 may include a plurality of test memory blocks TMB0~TMB15. The test memory blocks TMB0~TMB15 may be obtained by dividing a plurality of memory cells of the memory bank 100 into units of repair. Any one test memory block 110 of the test memory blocks TMB0~TMB15 may include a predetermined number of memory cells that share a word line WL and a column selection line CSL.

Figure 2:
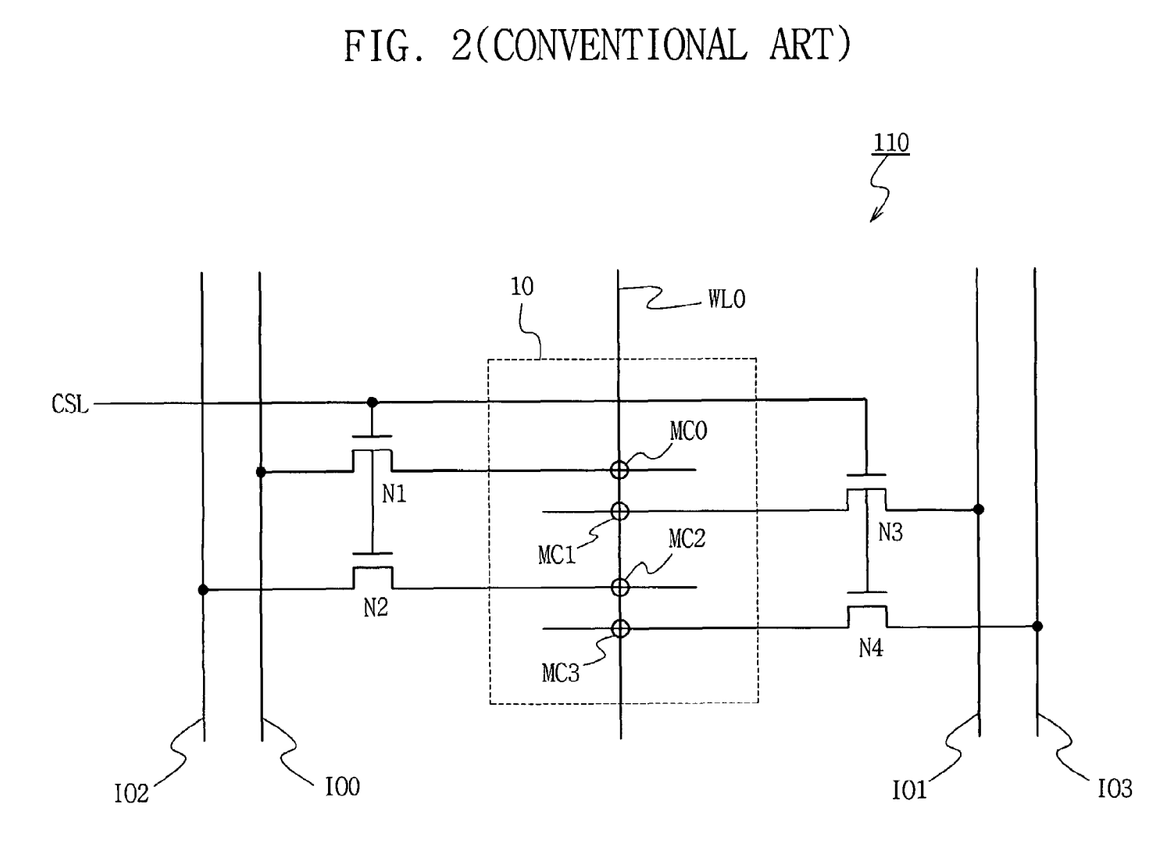
FIG. 2 is a schematic diagram illustrating a test memory block as shown in FIG. 1.

FIG. 2 illustrates an example test memory block 110. With reference to FIG. 2, the test memory block 110 may include a plurality of memory cells, such as the four memory cells MC0, MC1, MC2 and MC3. The memory cells MC0, MC1, MC2 and MC3 may be arrayed in a matrix, and each memory cell may include one access transistor and one capacitor (not shown). Gate terminals of the access transistors of the memory cells MC0, MC1, MC2, MC3 may be connected to a word line WL0, and source/drain terminals of the access transistors may be connected to bit lines. Each of the bit lines may be connected to source/drain terminals of corresponding column selection transistors N1, N2, N3, N4. Gate terminals of the column selection transistors N1, N2, N3 and N4 may be connected to a column selection line CSL and may receive column selection signals. Source/drain terminals of each of the column selection transistors N1, N2, N3 and N4 may be respectively connected to corresponding input/output lines IO0, IO1, IO2, IO3. In the parallel bit test, the input/output lines IO0, IO1, IO2 and IO3 may be connected to a parallel bit test logic unit 130 within the parallel bit test logic block 150.

The parallel bit test logic block 150 may include a plurality of test logic units L01 to L15, which are identified by the reference numbers 130 to 145. The test logic units 130 to 145 may generally correspond to the number, e.g., sixteen, of input/output pads 170.

Figure 3:
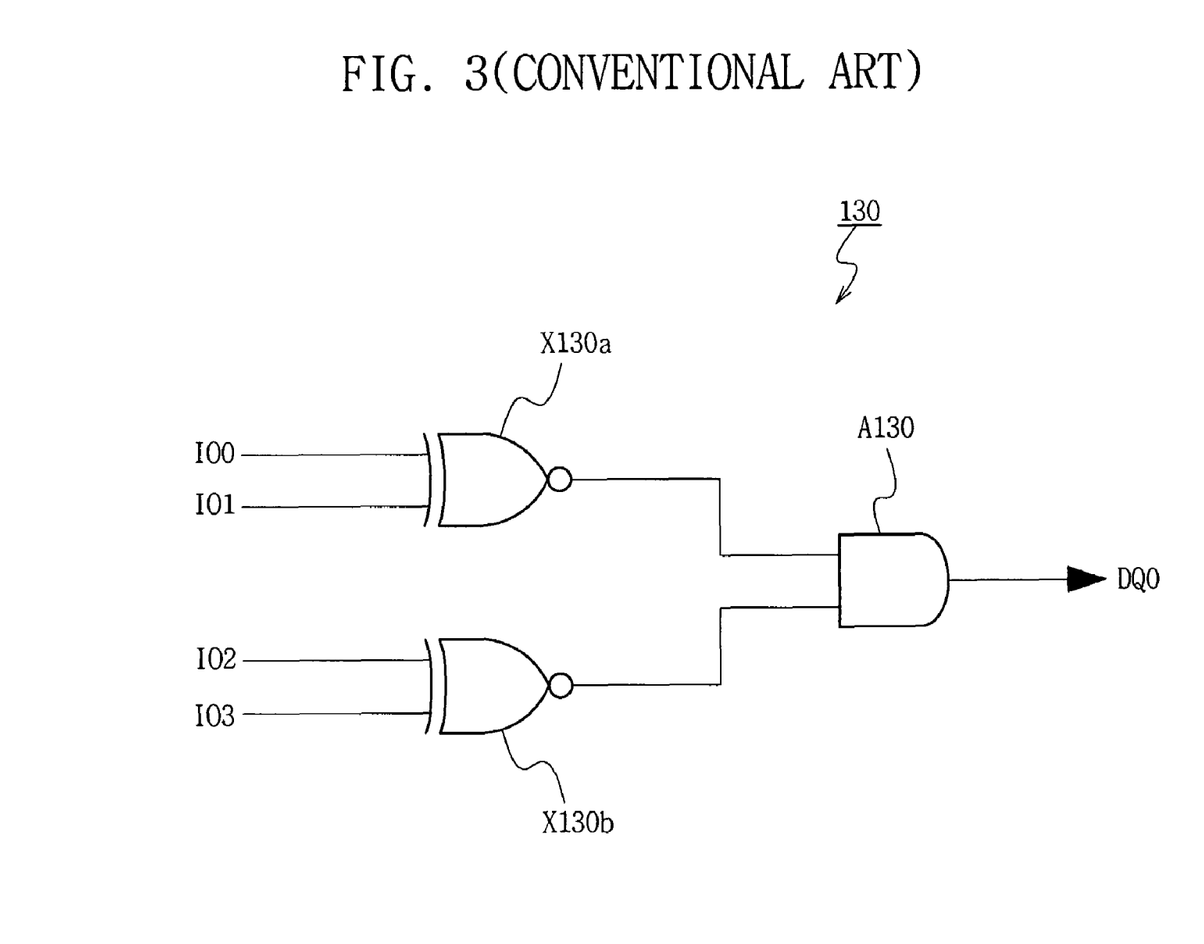
FIG. 3 is a schematic diagram illustrating a test logic unit as shown in FIG. 1.

FIG. 3 illustrates the test logic unit L01 130 of the test logic units 130 to 145 included in the parallel bit test logic block 150. As shown in FIG. 3, the test logic unit 130 may include XNOR logic circuits X130a and X130b configured to respectively compare whether or not logic levels of two input data lines are equal, and an AND circuit A130 connected to output terminals of the XNOR logic circuits X130a and X130b. The AND circuit A130 is configured to provide an output signal to a data input/output pad DQ0 through an AND operation.

Operation of the test logic unit 130 will now be described in greater detail. In particular, XNOR logic circuit X130a may receive data signals from the memory cells MC0 and MC1 through two input/output lines IO0 and IO1, and may perform an XNOR logic operation thereon and output the result. Two input/output lines IO0 and IO1 connected to the XNOR logic circuit X130a are selected from the input/output lines IO0, IO1, IO2 and IO3. When logic levels of the data signals of the memory cells MC0 and MC1 are received at the same level, e.g., both at logic "high" levels or both at logic "low" levels, the output of the XNOR logic circuit X130a may be a logic a high level.

For example, when the data pre-stored in the memory cells MC0 and MC1 is a logic high level and the memory cells have no defects, the output of the XNOR logic circuit X130a may be a logic high level. Further, when the data pre-stored in the memory cells MC0 and MC1 is a logic low level and the memory cells have no defects, the output of the XNOR logic circuit X130a may still be a logic high level. On the other hand, if the data pre-stored in the memory cells MC0 and MC1 is a logic high or low level and one of the memory cells is defective, the output of the XNOR logic circuit X130a may be a logic low level.

Likewise, XNOR logic circuit X130b may receive data signals from the memory cells MC2 and MC3 through two input/output lines IO2 and IO3, and may perform an XNOR logic operation thereon and outputs the result. In the XNOR logic circuit X130b, when the memory cells MC2 and MC3 have no defects, a logic high level signal may be output, and when one of the memory cells is defective, a logic "low" level signal may be output.

The AND logic circuit A130 connected to the XNOR logic circuits X130a and X130b may receive the outputs of the XNOR logic circuits X130a and X130b, and may perform an AND logic operation thereon, and provide an output signal to a data input/output pad DQ0. When the output of the AND logic circuit A130 has a logic high level, it is decided as a "pass", and when the output of the AND logic circuit A130 has a logic low level, it is decided as a "fail." When a "fail" result is decided, the test memory block 110 may be repaired.

As described above, in a conventional parallel bit test of a semiconductor memory device, it may be difficult to increase the number of channels in the test equipment. Thus one memory bank may be tested first and then another memory bank may be tested. As such, the total test time for memory cells may be extended, which may increase costs and/or decrease productivity.

SUMMARY OF THE INVENTION

Accordingly, some embodiments of the present invention provide a semiconductor memory device and a method of testing the same, which may reduce test time. In the device, two or more memory banks may be tested simultaneously, which may reduce expense for a test and/or increase productivity.

According to some embodiments of the invention, a semiconductor memory device having a plurality of memory banks of which each has a plurality of test memory blocks, to select at least two memory banks and perform a test simultaneously, may include a test unit configured to select each one logic operation signal by a unit of memory bank, from among logic operation signals obtained by performing an independent logic operation on respective test memory blocks of selected memory banks, and perform each logic operation of selected logic operation signal, and each transmit the logic operation result to an input/output pad; and a flag signal generator configured to compare and logically operate logic operation signals sharing the same memory bank from among the logic operation signals, and output flag signals to provide error information for respective memory banks.

Each of the test memory blocks may be a unit of repair. The test unit may include a first logic operation block and a second logic operation block. The first logic operation block may have first logic operation parts corresponding to the number of the test memory blocks. The first logic operation part may be configured to logically operate data signals output from memory cells of any one test memory block from among the test memory blocks and to output one logic operation signal. The second logic operation block may have second logic operation parts corresponding to the number of input/output pads. The second logic operation part may be configured to select each one per memory bank from logic operation signals output from the first logic operation block and to perform a logic operation therefor and transmit the logically operated result to one corresponding input/output pad.

Each test memory block may include a plurality of memory cells that share a word line and a column selection line. The first logic operation part may include a plurality of XNOR logic circuits configured to individually logically operate a plurality of data signals output from the memory cells, and at least one or more AND logic circuits configured to logically operate output signals from the XNOR logic circuits. The second logic operation part may include at least one AND circuit.

The flag signal generator may include comparators corresponding to the number of selected memory banks. The comparator may be configured to perform a logic operation for logic operation signals sharing the same memory bank, from among logic operation signals output from the first logic operation block, and to provide an output. The comparator may include at least one AND circuit.

According to further embodiments of the invention, a semiconductor memory device having a plurality of memory banks of which each has a plurality of test memory blocks divided in a unit to perform a repair, to select two memory banks and perform a test simultaneously, may include a test unit configured to select each one by a unit of memory bank and perform each logic operation and each transmit the logic operation result to an input/output pad; and a flag signal generator configured to generate a first flag signal to compare and logically operate all of logic operation signals of test memory blocks in the first memory bank, and a second flag signal to compare and logically operate all of logic operation signals of test memory blocks in the second memory bank, to provide information for a memory bank having an error occurrence.

Each of the test memory blocks may include a plurality of memory cells sharing a word line and a column selection line. The test unit may include a first logic operation block and a second logic operation block. The first logic operation block may have first logic operation parts corresponding to the number of the test memory blocks. The first logic operation part may be configured to independently, logically, operate data signals output from memory cells of any one test memory block from among the test memory blocks and to perform a test. The second logic operation block may have second logic operation parts corresponding to the number of input/output pads. The second logic operation part may be configured to select any one of logic operation signals of the first memory bank and any one of operation signals of the second memory bank, and to logically operate between the signals and transmit the result to a corresponding input/output pad. The first logic operation part may include a plurality of XNOR logic circuits configured to individually logically operate a plurality of data signals output from the memory cells, and at least one AND logic circuit configured to logically operate output signals from the XNOR logic circuits. The second logic operation part may include at least one AND circuit. The flag signal generator may include comparators corresponding to the number of selected memory banks. The comparator may perform a logic operation for logic operation signals sharing the same memory bank, from among logic operation signals output from the first logic operation block.

According to still further embodiments of the invention, a method of selecting at least two memory banks and simultaneously testing the memory banks, in a semiconductor memory device having a plurality of memory banks of which each has a plurality of test memory blocks, and a plurality of input/output pads, may include outputting logic operation signals obtained by independently, logically, operating output data signals on respective test memory blocks of selected memory banks; selecting each logic operation signal based on a unit of memory bank from among the logic operation signals, logically operating the selected logic operation signals, and each transmitting the result to a corresponding input/output pad; and comparing and logically operating logic operation signals sharing the same memory bank from among the logic operation signals, and outputting flag signals to provide error information for each memory bank.

Each of the test memory blocks may include a plurality of memory cells sharing a word line and a column selection line. The method may further include deciding whether or not an error occurs from at least two test memory blocks corresponding to the input/output pad, by using the signal transmitted to the input/output pad. The method may further include selecting and repairing one test memory block having an error from among the at least two test memory blocks by using the information provided through the flag signals, after deciding whether or not the error occurred from at least two test memory blocks.

According to some embodiments of the present invention, an integrated circuit device may include a test circuit and at least one flag generator circuit. The test circuit may be configured to generate first and second sets of test results in parallel in response to a memory test operation. The first and second sets of test results may respectively correspond to first and second memory banks. The test circuit may further be configured to merge respective ones of the first set of test results with respective ones of the second set of test results to provide a set of merged test results to respective ones of a set of output terminals of the integrated circuit device. The at least one flag generator circuit may be configured to generate a first flag signal that indicates a presence of at least one memory test error in the first set of test results and a second flag signal that indicates a presence of at least one memory test error in the second set of test results.

In some embodiments, the first and second memory banks may respectively include a plurality of memory blocks therein. Each of the first set of test results may correspond to one of the plurality of memory blocks of the first memory bank, and each of the second set of test results may correspond to one of the plurality of memory blocks of the second memory bank. A presence of a memory test error in at least one of the set of merged test results may indicate a presence of a defective memory cell in at least one of the corresponding ones of the plurality of memory blocks of the first and second memory banks.

In other embodiments, the presence of the at least one memory test error in the first set of test results may indicate a presence of at least one defective memory cell in the plurality of memory blocks of the first memory bank. Likewise, the presence of the at least one memory test error in the second set of test results may indicate a presence of at least one defective memory cell in the plurality of memory blocks of the second memory bank.

In some embodiments, the test circuit may be further configured to determine which of the plurality of memory blocks of the first and second memory banks includes a defective memory cell therein based on the set of merged test results and the first and second flag signals.

In other embodiments, the integrated circuit device may further include a redundant memory block. The test circuit may be further configured to replace at least one of the plurality of memory blocks of the first and second memory banks with the redundant memory block based on the set of merged test results and the first and second flag signals.

In some embodiments, the test circuit may include first, second, and third logic units. The first logic unit may be coupled to the plurality of memory blocks of the first memory bank, and may be configured to generate the first set of test results based on respective comparisons of test data stored in the corresponding ones of the plurality of memory blocks of the first memory bank. The second logic unit may be coupled to the plurality of memory blocks of the second memory bank, and may be configured to generate the second set of test results based on respective comparisons of test data stored in the corresponding ones of the plurality of memory blocks of the second memory bank. The third logic unit may be coupled to the first and second logic units, and may be configured to compare respective ones of the first set of test results with respective ones of the second set of test results to provide the set of merged test results.

In other embodiments, the first logic unit may be a first plurality of logic units. The first plurality of logic units may respectively include at least one XNOR circuit and at least one AND circuit configured to compare the test data stored in respective ones of the plurality of memory blocks of the first memory bank to generate the first set of test results. Likewise, the second logic unit may be a second plurality of logic units. The second plurality of logic units may respectively include at least one XNOR circuit and at least one AND circuit configured to compare the test data stored in the corresponding ones of the plurality of memory blocks of the second memory bank to generate the second set of test results.

In some embodiments, the third logic unit may be a third plurality of logic units. The third plurality of logic units may respectively include at least one AND circuit configured to compare respective ones of the first set of test results with respective ones of the second set of test results to provide the set of merged test results.

In other embodiments, the at least one flag generator circuit may include a first comparator circuit and a second comparator circuit. The first comparator circuit may be configured to generate the first flag signal based on a comparison of the first set of test results, and output the first flag signal to a first input/output pad. The second comparator circuit may be configured to generate the second flag signal based on a comparison of the second set of test results, and output the second flag signal to a second input/output pad.

In some embodiments, the first comparator circuit may include at least one AND circuit configured to compare the first set of test results to generate the first flag signal. Also, the second comparator circuit may include at least one AND circuit configured to compare the second set of test results to generate the second flag signal.

In other embodiments, the test circuit may be further configured to generate a third set of test results corresponding to a third memory bank in response to the memory test operation in parallel with the first and second sets of test results. The test circuit may also be configured to merge respective ones of the third set of test results with respective ones of the first set of test results and with respective ones of the second set of test results to provide the set of merged test results. In addition, the at least one flag signal generator may be further configured to generate a third flag signal that indicates a presence of at least one memory test error in the third set of test results, According to other embodiments of the present invention, an integrated circuit device may include M memory banks respectively including N memory blocks therein. M and N may be integers greater than 1. The device may also include N+M input/output pads, a parallel bit test circuit, and a flag signal generator. The parallel bit test circuit may be configured to couple one of the N memory blocks in each of the M memory banks to a corresponding one of N input/output pads, and output N pass/fail signals to corresponding ones of the N input/output pads respectively indicating that at least one of the memory blocks coupled thereto includes a defective memory cell therein. The flag signal generator may be configured to couple the N memory blocks in each of the M memory banks to corresponding ones of M input/output pads, and output M flag signals to the corresponding ones of the M input/output pads respectively indicating that at least one of the N memory blocks in the one of the M memory banks coupled thereto includes a defective memory cell therein.

According to further embodiments of the present invention, a method of testing an integrated circuit device may include generating first and second sets of test results in parallel in response to a memory test operation. The first and second sets of test results may respectively correspond to first and second memory banks. Respective ones of the first set of test results may be merged with respective ones of the second set of test results to provide a set of merged test results to respective ones of a set of output terminals of the integrated circuit device. In addition, a first flag signal may be generated that indicates a presence of at least one memory test error in the first set of test results, and a second flag signal may be generated that indicates a presence of at least one memory test error in the second set of test results.

In some embodiments, each of the first set of test results may correspond to one of a plurality of memory blocks of the first memory bank, and each of the second set of test results may correspond to one of a plurality of memory blocks of the second memory bank. A presence of a memory test error in at least one of the set of merged test results may indicate a presence of a defective memory cell in at least one of the corresponding ones of the plurality of memory blocks of the first and second memory banks.

In other embodiments, the presence of the at least one memory test error in the first set of test results may indicate a presence of at least one defective memory cell in the plurality of memory blocks of the first memory bank, and the presence of the at least one memory test error in the second set of test results may indicate a presence of at least one defective memory cell in the plurality of memory blocks of the second memory bank.

In some embodiments, which of the plurality of memory blocks of the first and second memory banks includes a defective memory cell therein may be determined based on the set of merged test results and the first and second flag signals. In addition, at least one of the plurality of memory blocks of the first and second memory banks may be replaced based on the set of merged test results and the first and second flag signals.

In other embodiments, the first set of test results may be generated based on respective comparisons of test data stored in the corresponding ones of the plurality of memory blocks of the first memory bank. Also, the second set of test results may be generated based on respective comparisons of test data stored in the corresponding ones of the plurality of memory blocks of the second memory bank. Respective ones of the first set of test results may be compared with respective ones of the second set of test results to provide the set of merged test results.

In some embodiments, test data stored in a plurality of memory cells of a first one of the plurality of memory blocks of the first memory bank may be compared using at least one XNOR circuit and at least one AND circuit to generate a first one of the first set of test results. In addition, test data stored in a plurality of memory cells of a first one of the plurality of memory blocks of the second memory bank may be compared using at least one XNOR circuit and at least one AND circuit to generate a first one of the second set of test results.

In other embodiments, respective ones of the first set of test results may be compared with respective ones of the second set of test results using at least one AND circuit to provide the set of merged test results.

In some embodiments, the first flag signal may be generated based on a comparison of the first set of test results, and the second flag signal may be generated based on a comparison of the second set of test results. The first flag signal may be provided to a first input/output pad, and the second flag signal may be provided to a second input/output pad.

In other embodiments, the first set of test results may be compared using at least one AND circuit to generate the first flag signal. Likewise, the second set of test results may be compared using at least one AND circuit to generate the second flag signal.

In some embodiments, a third set of test results may be generated in response to the memory test operation in parallel with the first and second sets of test results. The third set of test results may correspond to a third memory bank. In addition, a third flag signal may be generated that indicates a presence of at least one memory test error in the third set of test results. Respective ones of the third set of test results may be merged with respective ones of the first set of test results and with respective ones of the second set of test results to provide the set of merged test results.

DETAILED DESCRIPTION OF THE EMBODIMENTS OF THE INVENTION

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of elements and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein, such as those defined in commonly used dictionaries, should be interpreted as having a meaning that is consistent with their meaning in the context of this specification and/or the relevant art and will not be interpreted in an idealized or overly formal sense unless expressly so defined herein. Exemplary embodiments of the present invention are more fully described below with reference to FIGS. 4 to 8.

Figure 4:
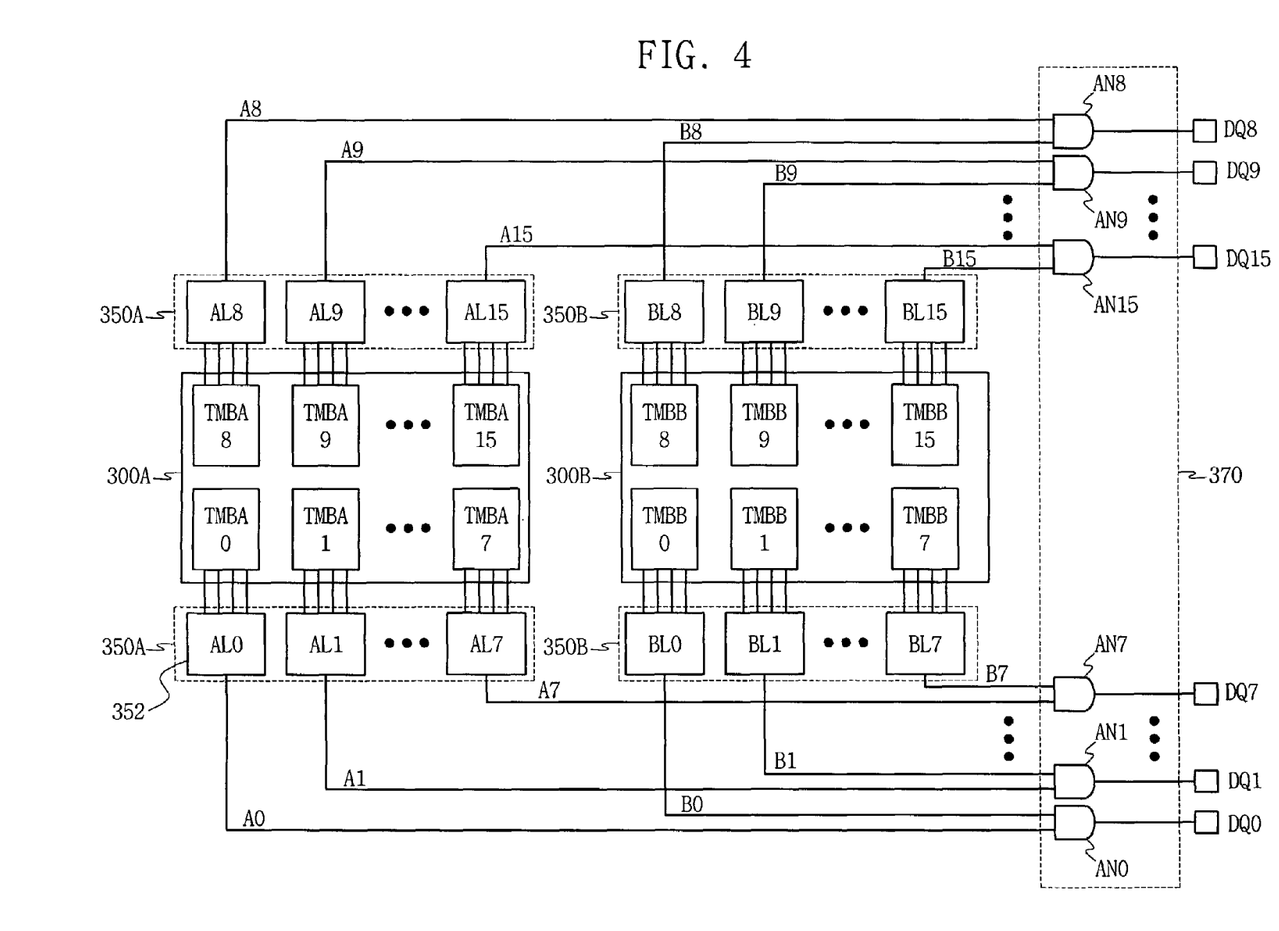
FIGS. 4 to 6 are schematic diagrams illustrating devices for parallel bit testing according to some embodiments of the invention.
Figure 5:
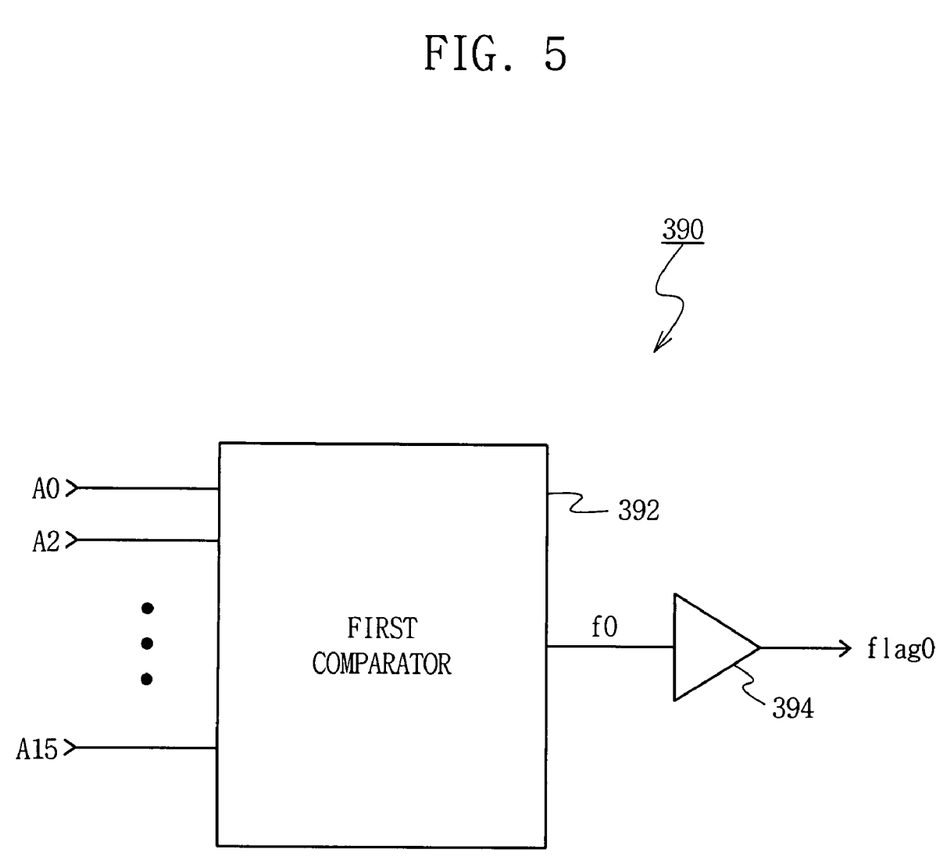
Figure 6:
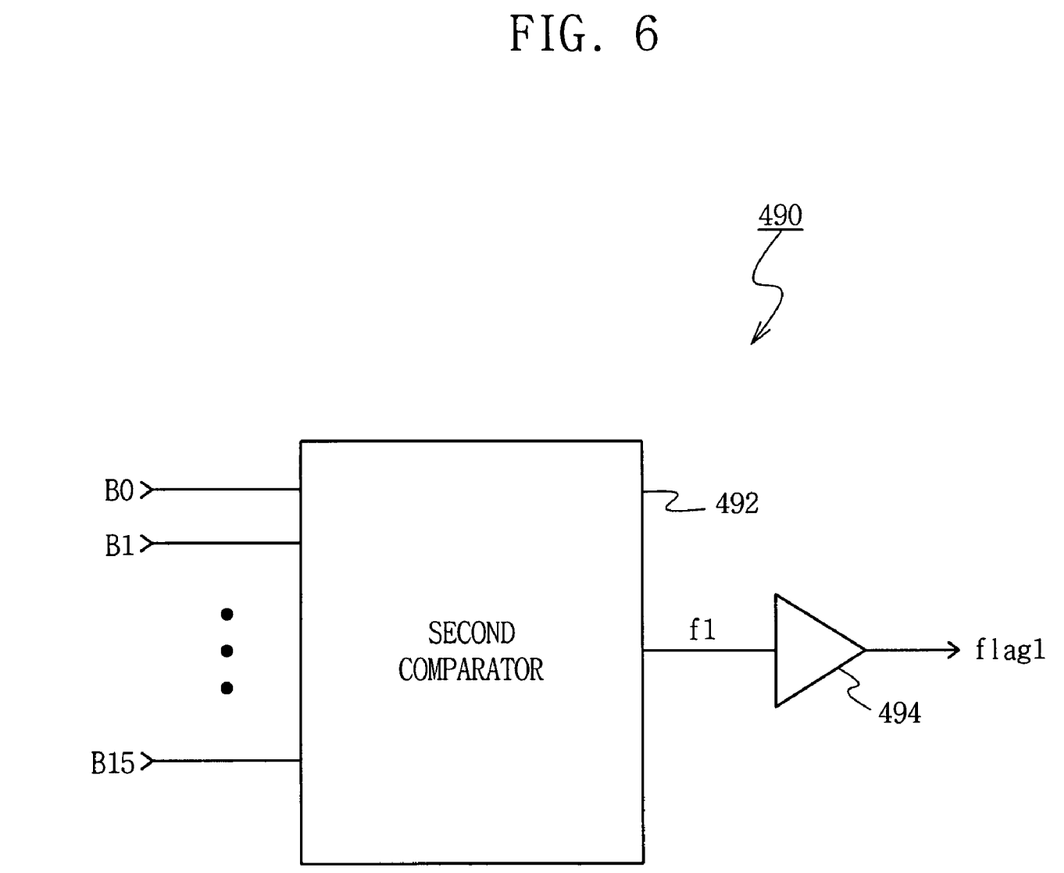
Figure 7:
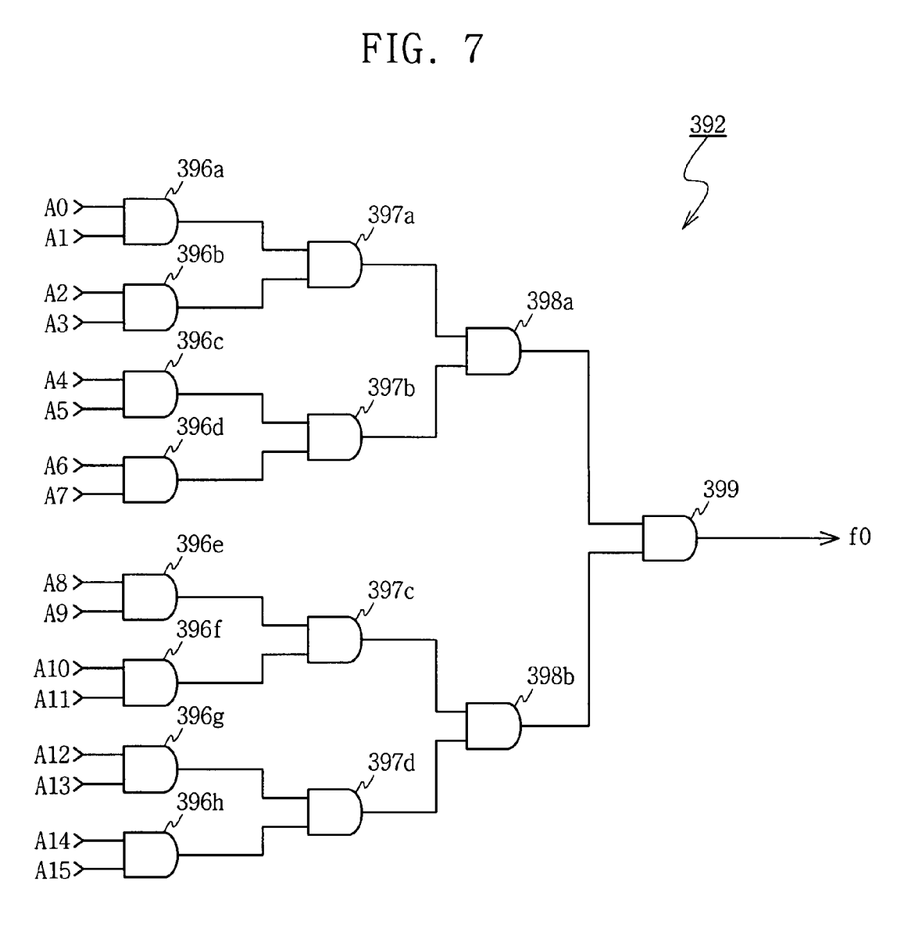
FIG. 7 is a circuit diagram illustrating the first comparator of FIG. 5 according to some embodiments of the invention.
Figure 8:
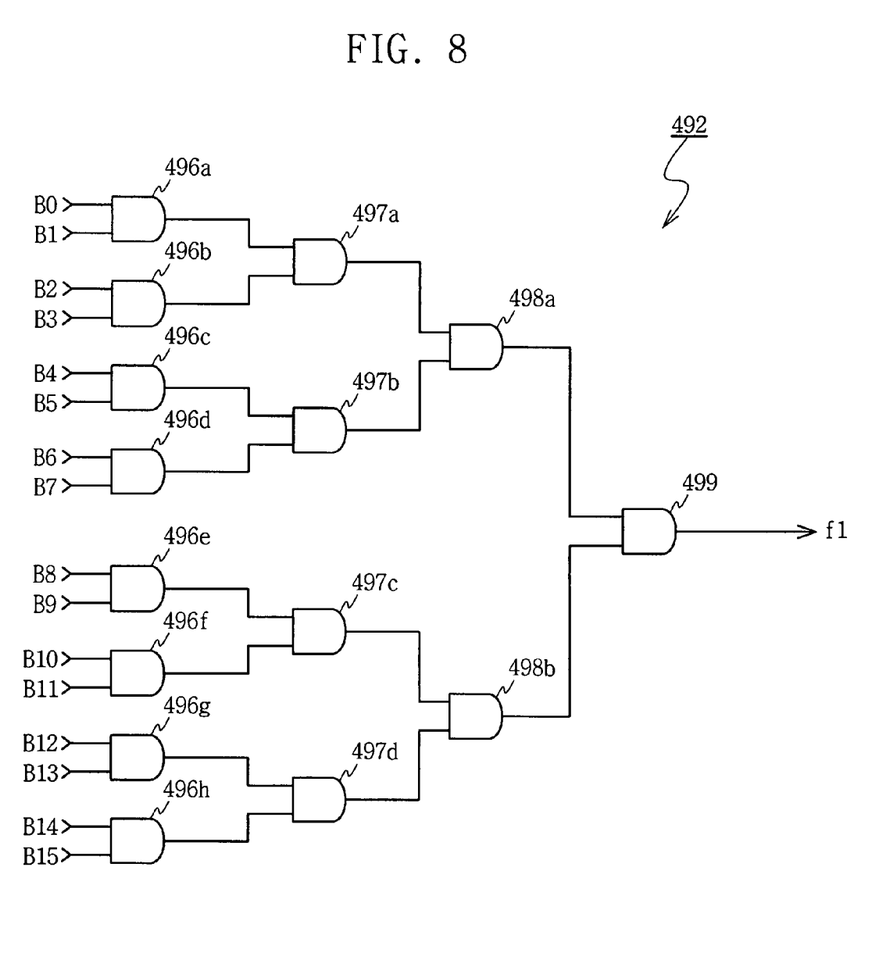
FIG. 8 is a circuit diagram illustrating the second comparator of FIG. 6 according to some embodiments of the invention.

FIGS. 4 to 6 illustrate an integrated circuit device configured to perform a parallel bit test according to some embodiments of the present invention. More particularly, FIG. 4 illustrates a parallel bit test circuit in a semiconductor memory device where multiple memory banks are tested in parallel and/or substantially simultaneously according to some embodiments of the present invention. FIGS. 5 and 6 illustrate examples of first and second flag signal generators according to some embodiments of the present invention.

As shown in FIGS. 4 to 6, a semiconductor memory device according to some embodiments of the invention includes at least two memory banks 300A and 300B, parallel bit test circuits 350A, 350B, and 370, flag signal generators 390 and 490, and input/output pads DQ0 to DQ15. As used herein, a memory bank may include one or more memory blocks therein, and a memory block may include one or more memory cells therein.

A semiconductor memory device configured to perform a parallel bit test according to some embodiments of the present invention includes a plurality of memory banks, and selects at least two memory banks and performs a test of the memory banks to provide at least two sets of test results substantially simultaneously and/or in parallel. Although discussed herein with reference to two memory banks being selected and tested simultaneously, three or more memory banks may be selected and tested in parallel in accordance with some embodiments of the present invention.

Referring now to FIG. 4, each of the memory banks 300A and 300B includes test memory blocks (TMBA0~TMBA15 and TMBB0~TMBB15, respectively). The number of test memory blocks per memory bank is provided herein as corresponding to the number of data input/output terminals (or "pads") DQ0 to DQ15 (e.g., sixteen), but fewer or more test memory blocks and/or input/output terminals may be provided. Further, the memory bank 300A may be referred to herein as "A" bank, and the memory bank 300B may be referred to herein as "B" bank.

Test memory blocks TMBA0~TMBA15 of the A bank 300A may be designated by dividing the plurality of memory cells of A bank 300A into units of repair. Likewise, test memory blocks TMBB0~TMBB15 of the B bank 300B may be designated by dividing the plurality of memory cells of B bank 300B into units of repair. Each of the test memory blocks TMBA0~TMBA15 and TMBB0~TMBB15 may include a predetermined number of memory cells sharing a word line WL and a column selection line CSL. However, the test memory blocks may include a plurality of memory cells selected by other methods as are well-known in the art.

For example, the test memory blocks TMBA0~TMBA15 and/or TMBB0~TMBB15 may generally employ a similar configuration as that of the memory block of FIG. 2. More particularly, each of the test memory blocks TMBA0~TMBA15 and TMBB0~TMBB15 may include a plurality of memory cells MC0, MC1, MC2 and MC3. The memory cells MC0, MC1, MC2 and MC3 may be arrayed in a matrix of rows and columns, and each memory cell may include one access transistor and one capacitor. Gate terminals of the access transistors of the memory cells MC0, MC1, MC2 and MC3 may be connected to a word line WL0, and source/drain terminals of the access transistors may be connected to respective bit lines. Each of the bit lines may be connected to source/drain terminals of corresponding column selection transistors N1, N2, N3 and N4. Gate terminals of the column selection transistors N1, N2, N3 and N4 may be connected with the column selection line CSL to receive column selection signals. Source/drain terminals of the column selection transistors N1, N2, N3 and N4 may be connected to respective input/output lines IO0, IO1, IO2 and IO3. During parallel bit testing, the input/output lines IO0, IO1, IO2 and IO3 may be connected to test circuits 350A, 350B, and/or 370.

The parallel bit test circuits 350A, 350B, and 370 are configured to select one logic operation signal from each memory bank (from among logic operation signals obtained by performing an independent logic operation on respective test memory blocks TMBA0~TMBA15 and TMBB0~TMBB15 of two memory banks 300A and 300B), and then perform a logic operation on the signals, and transmit the result to one of the data input/output pads DQ0 to DQ15.

The parallel bit test circuits 350A, 350B, and 370 may be provided as first and second logic operation blocks 350A and 350B, and third logic operation block 370. The first and second logic operation blocks 350A and 350B may respectively include a plurality of first and second logic operation units (AL0 to AL15 and BL0 to BL15, respectively) that are configured to independently perform logical operations on data signals from the respective test memory blocks TMBA0~TMBA15 and TMBB0~TMBB15 and output corresponding logic signals. For example, if the number of input/output pads is sixteen, the first logic units may include sixteen first-logic units AL0 to AL15 corresponding to the sixteen memory blocks TMBA0~TMBA15 of A bank 300A, and the second logic units may include sixteen second logic units BL0 to BL15 corresponding to the sixteen memory blocks TMBB0~TMBB15 of B bank 300B.

One first logic unit AL0 352 from among the first and second logic units AL0 to AL15 and BL0 to BL15 may have a similar configuration as that of the parallel bit test logic unit 130 of FIG. 3.

For example, the first logic unit 352 may include XNOR logic circuits X130a and X130b to individually compare whether or not logic levels of two input data signals are equal, and an AND circuit A130 connected with output terminals of the XNOR logic circuits X130a and X130b to provide an output signal to a data input/output pad DQ0.

Operation of the first logic unit 352 will now be described in greater detail. In particular, the XNOR logic circuit X130a receives, through two input terminals, data signals from the memory cells MC0 and MC1 provided through two input/output lines IO0 and IO1, and performs a logic operation thereon and outputs the result. When the data signals of the memory cells MC0 and MC1 are received at the same level, e.g., both at logic "high" levels or both at logic "low" levels, the output of the XNOR circuit X130a is provided at a logic "high" level.

For example, if test data pre-stored in the memory cells MC0 and MC1 is at a logic "high" level and the memory cells MC0 and MC1 have no defects, the output of the XNOR logic circuit X130a is a logic "high" signal. Similarly, if test data pre-stored in the memory cells MC0 and MC1 is at a logic "low" level and the memory cells MC0 and MC1 have no defects, the output of the XNOR logic circuit X130a is also a logic "high" level. On the other hand, if test data pre-stored in the memory cells MC0 and MC1 is at a logic "high" or "low" level and one of the memory cells MC0 and MC1 is defective, different logic levels may be received at the XNOR circuit X130a, such that the output of the XNOR logic circuit X130a will be a logic "low" signal.

Likewise, XNOR logic circuit X130b receives, through two input terminals, data signals from the memory cells MC2 and MC3 provided through two input/output lines IO2 and IO3, and performs a logic operation thereon and outputs the result. In the XNOR logic circuit X130b, if the memory cells MC2 and MC3 have no defects, a logic "high" signal is output, and if one or more memory cells have defects, a logic "low" signal is output.

An AND logic circuit A130 connected to the output terminals of the XNOR logic circuits X130a and X130b receives the outputs of the XNOR logic circuits X130a and X130b, and performs a logic operation thereon to provide an output signal to data input/output pad DQ0. When the output of the AND logic circuit A130 is a logic "high" level, it indicates a "pass", and when the output is a logic "low" level, it indicates a "fail", i.e., that one or more of the memory cells MC1, MC2, MC3, and/or MC4 of memory block TMBA0 is defective.

Accordingly, first and second logic units AL0 to AL15 and BL0 to BL15 having the above-mentioned structure and operation respectively output first and second sets of test results (i.e., logic signals A0 to A15 and B0 to B15, respectively) obtained by logically operating respective data signals from corresponding test memory blocks TMBA0~TMBA15 and TMBB0~TMBB15.

In the third logic operation block 370, third logic units AN0 to AN15, each of which includes at least one AND circuit, select one logic signal per memory bank from the logic signals A0 to A15 and B0 to B15 that are output from the first logic operation block 350A and 350B, perform logical operations thereon to merge respective ones of the selected logic signals, and respectively transmit the set of merged results to respective data input/output pads DQ0-DQ15. For example, one logic operation signal, e.g., A0, from the logic operation signals A0 to A15 corresponding to the A bank 300A, may be selected, and one logic operation signal, e.g., B0, from the logic operation signals B0 to B15 corresponding to the B bank 300B, may be selected. Then, an AND logic operation is performed on the selected signals A0 and B0, and the result is output to a corresponding data input/output pad, e.g., DQ0. A failed or defective memory cell in the corresponding memory blocks may be determined by analyzing the signals output from data input/output pads DQ0 to DQ15. For example, when a logic "low" level signal is input to data input/output pad DQ0, and a logic "high" level signal is input to the rest of the data input/output pads DQ1 to DQ15 from the second logic units AN0 to AN15, a "fail" occurrence in one of the test memory block TMBA0 of A bank 300A or test memory block TMBB0 of B bank 300B (corresponding to the data input/output pad DQ0) is indicated. As such, flag signal generators 390 and 490 (described below) may be used to determine in which of the two test memory blocks TMBA0 and TMBB0 of the different memory banks that the "fail" (i.e., defective memory cell) occurred.

More particularly, as shown in FIGS. 5 and 6, the flag signal generators 390 and 490 respectively compare logic signals A0 to A15 and B0 to B15 (respectively corresponding to memory banks A bank 300A and B bank 300B) output from the first logic operation blocks 350A and 350B, and respectively output flag signals flag0 and flag1 to indicate the presence of at least one memory test error in the sets of test results corresponding to the respective memory banks. The presence of a memory test error indicates that at least one of the memory blocks of the respective memory banks includes a defective memory cell. In other words, the flag signal generators 390 and 490 provide error information as to whether the "fail" occurrence was from A bank 300A or B bank 300B.

For example, the flag signal generator 390 is configured to generate a first flag signal flag0 to provide information on of the presence of defective memory cells in A bank 300A, and may include a first comparator 392 and a buffer 394. The first comparator 392 may include one or more AND logic circuits 396a, 396b, 396c, 396d, 396e, 396f, 396g, 396h, 397a, 397b, 397c, 397d, 398a, 398b, 399, with a wiring structure shown in FIG. 7. The first comparator 392 compares and performs logical operations on all of the logic signals A0 to A15 corresponding to A bank 300A. The buffer 394 buffers or amplifies an output signal f0 of the first comparator 392, and outputs a first flag signal flag0. For example, when all of the logic signals A0 to A15 corresponding to the A bank 300A have a logic "high" level, the first flag signal flag0 is output at a logic "high" level. However, when even one signal has a logic "low" level, the first flag signal flag0 is output at a logic "low" level. When the first flag signal flag0 has a logic "high" level, it indicates that the "fail" did not occur in the A bank 300A. In contrast, when the first flag signal flag0 has a logic "low" level, it indicates that the "fail" (i.e., the defective memory cell) is present in at least one test memory block of the A bank 300A.

Similarly, flag signal generator 490 is configured to generate a second flag signal flag1 to provide information regarding a "fail" occurrence in B bank 300B, and as such, may include a second comparator 492 and a buffer 494. The second comparator 492 may include one or more AND logic circuits 496a, 496b, 496c, 496d, 496e, 496f, 496g, 496h, 497a, 497b, 497c, 497d, 498a, 498b, 499, with a wire structure shown in FIG. 8. The second comparator 492 compares and performs logical operations in all of the logic signals B0 to B15 corresponding to B bank 300B. The buffer 494 buffers or amplifies an output signal f1 of the second comparator 492, and outputs a second flag signal flag1. For example, when all of the logic signals B0 to B15 corresponding to the B bank 300B have a logic "high" level, the second flag signal flag1 at a logic "high" level, but is output when even one logic signal has a logic "low" level, the second flag signal flag1 is output at a logic "low" level. When the second flag signal flag1 has a logic "high" level, it indicates that no defective memory cells are present in the B bank 300B. However, when the second flag signal flag1 has a logic "low" level, it indicates that a defective memory cell is present in at least one test memory block of the B bank 300B.

The first and second flag signals flag0 and flag1 may be output through input/output pads that are not generally used in a test mode. For example, the flag signals flag0 and flag1 may be output through input/output pads DQS and DQSB (not shown), which may generally be used to provide a clock signal to a controller in a semiconductor memory device supporting a DDR (Double Data Rate).

In summary, when an input/output pad, e.g. DQ0, receives a logic "low" signal, the parallel bit test circuits 350A, 350B, and 370 decide that a "fail" occurred in at least one of two test memory blocks TMBA0 and TMBB0 connected to the input/output pad DQ0. Also, based on flag signals flag0 and flag1, the parallel bit test circuit determines which bank (e.g., A bank or B bank) includes a test memory block having a defective memory cell therein. In other words, when the first flag signal flag0 has a logic "low" level (indicating the presence of a memory test error), it indicates that a "fail" occurred in test memory block TMBA0 of the A bank 300A, and as such, the test memory block TMBA0 is repaired. In addition, when the second flag signal flag1 has a logic "low" level, it indicates that a "fail" occurred in test memory block TMBB0 of the B bank 300B, and the test memory block TMBB0 is repaired.

Moreover, it may be possible for a "fail" to occur simultaneously in memory blocks of both A bank 300A and B bank 300B that are connected to different input/output pads. That is, a "fail" may occur in a test memory block TMBA0 of A bank 300A connected to data input/output pad DQ0, and a "fail" may occur in a test memory block TMBB0 of B bank 300B connected to data input/output pad DQ1. As such, both data input/output pads DQ0 and DQ1 may receive a logic "low" level signal, and the flag signals flag0 and flag1 may also both have a logic "low" level. In this case, it may not be possible to determine which test memory block includes defective memory cells based only on signals received through the data input/output pads DQ0 and DQ1 and the flag signals flag0 and flag1. Thus, all of test memory blocks TMBA0, TMBB0, TMBA1 and TMBB1 corresponding to the input/output pads DQ0 and DQ1 may be repaired. However, as the probability of such an occurrence (i.e., a simultaneous failure in two memory banks) is relatively low, such a case may not greatly influence testing efficiency.

As described above, in a semiconductor memory device according to some embodiments of the invention, at least two or more memory banks may be tested in parallel. As such, test time may be reduced as compared with conventional devices, with an added expense of two input/output pads to provide the flag signals.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. For example, internal configuration of the circuits of FIGS. 4 to 8 may be varied, and/or internal devices of the circuits may be replaced with other equivalent devices. More generally, in the drawings and specification, there have been disclosed typical embodiments of the invention and, although specific terms are employed, they are used in a generic and descriptive sense only and not for purposes of limitation, the scope of the invention being set forth in the following claims.

That which is claimed:

1. An integrated circuit device, comprising:
a test circuit configured to generate first and second sets of test results corresponding to first and second memory banks, respectively, in parallel in response to a memory test operation, and configured to merge respective ones of the first set of test results with respective ones of the second set of test results to provide a set of merged test results to respective ones of a set of output terminals of the integrated circuit device; and
at least one flag generator circuit configured to generate a first flag signal that indicates a presence of at least one memory test error in the first set of test results and a second flag signal that indicates a presence of at least one memory test error in the second set of test results.

2. The device of claim 1, wherein the first and second memory banks respectively include a plurality of memory blocks therein, wherein each of the first set of test results corresponds to one of the plurality of memory blocks of the first memory bank, wherein each of the second set of test results corresponds to one of the plurality of memory blocks of the second memory bank, and wherein a presence of a memory test error in at least one of the set of merged test results indicates a presence of a defective memory cell in at least one of the corresponding ones of the plurality of memory blocks of the first and second memory banks.

3. The device of claim 2, wherein the presence of the at least one memory test error in the first set of test results indicates a presence of at least one defective memory cell in the plurality of memory blocks of the first memory bank, and wherein the presence of the at least one memory test error in the second set of test results indicates a presence of at least one defective memory cell in the plurality of memory blocks of the second memory bank.

4. The device of claim 3, wherein the test circuit is further configured to determine which of the plurality of memory blocks of the first and second memory banks includes a defective memory cell therein based on the set of merged test results and the first and second flag signals.

5. The device of claim 3, wherein the integrated circuit device further comprises a redundant memory block, and wherein the test circuit is further configured to replace at least one of the plurality of memory blocks of the first and second memory banks with the redundant memory block based on the set of merged test results and the first and second flag signals.

6. The device of claim 2, wherein the test circuit comprises:
a first logic unit coupled to the plurality of memory blocks of the first memory bank and configured to generate the first set of test results based on respective comparisons of test data stored in the corresponding ones of the plurality of memory blocks of the first memory bank;
a second logic unit coupled to the plurality of memory blocks of the second memory bank and configured to generate the second set of test results based on respective comparisons of test data stored in the corresponding ones of the plurality of memory blocks of the second memory bank; and
a third logic unit coupled to the first and second logic units and configured to compare respective ones of the first set of test results with respective ones of the second set of test results to provide the set of merged test results.

7. The device of claim 6, wherein the first logic unit comprises a first plurality of logic units respectively comprising at least one XNOR circuit and at least one AND circuit configured to compare the test data stored in respective ones of the plurality of memory blocks of the first memory bank to generate the first set of test results, and wherein the second logic unit comprises a second plurality of logic units respectively comprising at least one XNOR circuit and at least one AND circuit configured to compare the test data stored in respective ones of the plurality of memory blocks of the second memory bank to generate the second set of test results.

8. The device of claim 6, wherein the third logic unit comprises a third plurality of logic units respectively comprising at least one AND circuit configured to compare respective ones of the first set of test results with respective ones of the second set of test results to provide the set of merged test results.

9. The device of claim 2, wherein the at least one flag generator circuit comprises:
  a first comparator circuit configured to generate the first flag signal based on a comparison of the first set of test results and output the first flag signal to a first input/output pad; and
  a second comparator circuit configured to generate the second flag signal based on a comparison of the second set of test results and output the second flag signal to a second input/output pad.

10. The device of claim 9, wherein the first comparator circuit comprises at least one AND circuit configured to compare the first set of test results to generate the first flag signal, and wherein the second comparator circuit comprises at least one AND circuit configured to compare the second set of test results to generate the second flag signal.

11. The device of claim 1, wherein the test circuit is further configured to generate a third set of test results corresponding to a third memory bank in response to the memory test operation in parallel with the first and second sets of test results, and merge respective ones of the third set of test results with respective ones of the first set of test results and with respective ones of the second set of test results to provide the set of merged test results,
  and wherein the at least one flag signal generator is further configured to generate a third flag signal that indicates a presence of at least one memory test error in the third set of test results.

12. An integrated circuit device, comprising:
  M memory banks respectively including N memory blocks therein, wherein M and N are integers greater than 1;
  N+M input/output pads;
  a parallel bit test circuit configured to couple one of the N memory blocks in each of the M memory banks to a corresponding one of N input/output pads and configured to output N pass/fail signals to corresponding ones of the N input/output pads respectively indicating that at least one of the memory blocks coupled thereto includes a defective memory cell therein; and
  a flag signal generator configured to couple the N memory blocks in each of the M memory banks to corresponding ones of M input/output pads and configured to output M flag signals to the corresponding ones of the M input/output pads respectively indicating that at least one of the N memory blocks in the one of the M memory banks coupled thereto includes a defective memory cell therein.

13. A method of testing an integrated circuit device, the method comprising:
  generating first and second sets of test results in parallel in response to a memory test operation, the first and second sets of test results respectively corresponding to first and second memory banks;
  merging respective ones of the first set of test results with respective ones of the second set of test results to provide a set of merged test results to respective ones of a set of output terminals of the integrated circuit device; and
  generating a first flag signal that indicates a presence of at least one memory test error in the first set of test results; and
  generating a second flag signal that indicates a presence of at least one memory test error in the second set of test results.

14. The method of claim 13, wherein each of the first set of test results corresponds to one of a plurality of memory blocks of the first memory bank, wherein each of the second set of test results corresponds to one of a plurality of memory blocks of the second memory bank, and wherein a presence of a memory test error in at least one of the set of merged test results indicates a presence of a defective memory cell in at least one of the corresponding ones of the plurality of memory blocks of the first and second memory banks.

15. The method of claim 14, wherein the presence of the at least one memory test error in the first set of test results indicates a presence of at least one defective memory cell in the plurality of memory blocks of the first memory bank, and wherein the presence of the at least one memory test error in the second set of test results indicates a presence of at least one defective memory cell in the plurality of memory blocks of the second memory bank.

16. The method of claim 15, further comprising:
  determining which of the plurality of memory blocks of the first and second memory banks includes a defective memory cell therein based on the set of merged test results and the first and second flag signals.

17. The method of claim 15, further comprising:
  replacing at least one of the plurality of memory blocks of the first and second memory banks based on the set of merged test results and the first and second flag signals.

18. The method of claim 14, wherein generating the first and second sets of test results in parallel comprises:
  generating the first set of test results based on respective comparisons of test data stored in the corresponding ones of the plurality of memory blocks of the first memory bank; and
  generating the second set of test results based on respective comparisons of test data stored in the corresponding ones of the plurality of memory blocks of the second memory bank,
  and wherein merging comprises comparing respective ones of the first set of test results with respective ones of the second set of test results to provide the set of merged test results.

19. The method of claim 18, wherein generating the first set of test results comprises comparing test data stored in a plurality of memory cells of a first one of the plurality of memory blocks of the first memory bank using at least one XNOR circuit and at least one AND circuit, and wherein generating the second set of test results comprises comparing test data stored in a plurality of memory cells of a first one of the plurality of memory blocks of the second memory bank using at least one XNOR circuit and at least one AND circuit.

20. The method of claim 18, wherein merging further comprises:
  comparing respective ones of the first set of test results with respective ones of the second set of test results using at least one AND circuit to provide the set of merged test results.

21. The method of claim 13, wherein generating the first flag signal comprises generating the first flag signal based on a comparison of the first set of test results, wherein generating the second flag signal comprises generating the second flag signal based on a comparison of the second set of test results, and further comprising:
  providing the first flag signal to a first input/output pad; and
  providing the second flag signal to a second input/output pad.

22. The method of claim 21, wherein generating the first flag signal comprises comparing the first set of test results using at least one AND circuit, and wherein generating the second flag signal comprises comparing the second set of test results using at least one AND circuit.

23. The method of claim 13, further comprising:
generating a third set of test results in response to the memory test operation in parallel with generating the first and second sets of test results, the third set of test results corresponding to a third memory bank; and
generating a third flag signal that indicates a presence of at least one memory test error in the third set of test results, wherein merging comprises merging respective ones of the third set of test results with respective ones of the first set of test results and with respective ones of the second set of test results to provide the set of merged test results.

* * * * *